United States Patent [19]

Nakano et al.

[11] Patent Number: 4,866,605
[45] Date of Patent: Sep. 12, 1989

[54] SYSTEM FUNCTION SIMULATION METHOD AND APPARATUS THEREFOR USING PETRI NET SYMBOLS

[75] Inventors: Toshihiko Nakano; Toshihiro Hayashi, both of Hitachi; Kenroku Nogi, Kokubunji; Kiyomi Mori, Hitachi, all of Japan

[73] Assignee: Hitachi, Ltd., Tokyo, Japan

[21] Appl. No.: 172,980

[22] Filed: Mar. 22, 1988

Related U.S. Application Data

[63] Continuation of Ser. No. 730,862, May 6, 1985, abandoned.

[30] Foreign Application Priority Data

Nov. 5, 1984 [JP] Japan ................................. 59-92870

[51] Int. Cl.⁴ ...................... G06F 15/00; G06F 15/16
[52] U.S. Cl. .................................................. 364/200
[58] Field of Search ... 364/200 MS File, 900 MS File, 364/300, 402, 578

[56] References Cited

U.S. PATENT DOCUMENTS

| Re. 31,287 | 6/1983 | Patil | 340/825.79 |
| 4,068,214 | 1/1978 | Patil | 340/825.87 |
| 4,293,783 | 10/1981 | Patil | 340/825.87 |
| 4,396,983 | 8/1983 | Segarra et al. | 364/200 |
| 4,644,461 | 2/1987 | Jennings | 364/200 |

OTHER PUBLICATIONS

"Putting Petri Nets to Work", *Computer*, by Agerwala,. Dec. 1979, pp. 85-94.

*Primary Examiner*—Gary V. Harkcom
*Assistant Examiner*—Lawrence E. Anderson
*Attorney, Agent, or Firm*—Antonelli, Terry & Wands

[57] ABSTRACT

In a method and a system for simulating a distributed system, a target system is divided into asynchronously operative processes so that the simulation of said asynchronously operative, distributed system may be comprehended with the changes in the data structures by using (1) a whole structure table indicating what certain of the said divided processes can provide for other processes, (2) a system structure table representing certain of said processes with a Petri net model, and (3) a data structure table storing the data structures of input and output processing data.

4 Claims, 15 Drawing Sheets

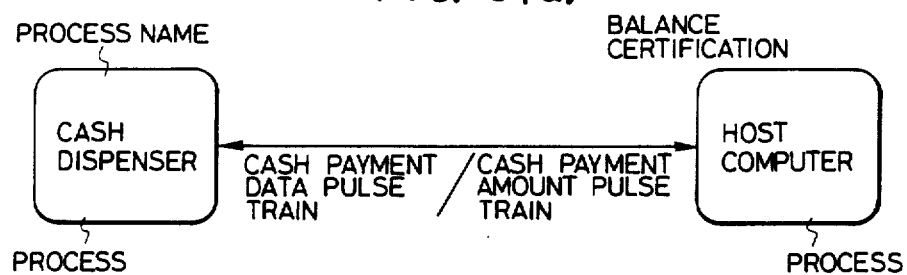
FIG. 9(a)
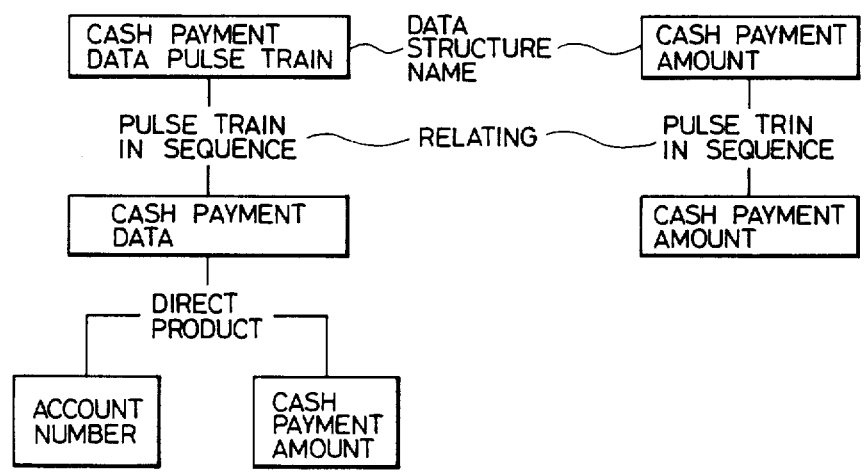
FIG. 9(b)
FIG. 9(c)
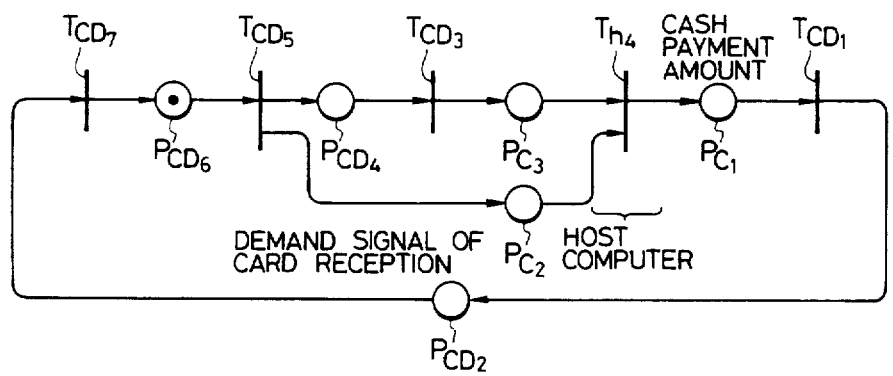
FIG. 9(d)

|  | CASH DISPENSER | HOST COMPUTER |
|---|---|---|
| CASH DISPENSER | — | BALANCE CERTIFICATION |
|  |  | CASH PAYMENT DATA PULSE TRAIN |
|  |  | CASH PAYMENT AMOUNT |
| HOST COMPUTER | — | — |

| | | | TCD7 | TCD5 | TCD3 | TCD4 | TCD1 |
|---|---|---|---|---|---|---|---|
| | | | CASH CARD RECEPTION | CASH CARD CERTIFICATION | CASH PAYMENT RECEPTION | BALANCE CERTIFICATION BY HOST COMPUTER | CASH PAYMENT |
| CASH DISPENSER | | | FUNCTION IS NOT DECIDED IN DETAIL | FUNCTION IS DECIDED AS SHOWN IN FIG. 3 | FUNCTION IS NOT DECIDED IN DETAIL | FUNCTION IS NOT DECIDED IN DETAIL | FUNCTION IS NOT DECIDED IN DETAIL |
| PCD6 | CARD NUMBER | 0 | −1 | 1 | 0 | 0 | 0 |
| PCD4 | RECEPTION DEMAND SIGNAL OF CASH PAYMENT | 0 | 0 | −1 | 1 | 0 | −1 |
| PC3 | CASH PAYMENT AMOUNT | 0 | 0 | 0 | −1 | 0 | 0 |
| PC2 | ACCOUNT NUMBER | 0 | 0 | −1 | 0 | 1 | 0 |
| PC1 | CASH PAYMENT AMOUNT | 0 | 0 | 0 | 0 | 1 | 1 |
| PCD2 | DEMAND SIGNAL OF CARD RECEPTION | 0 | 1 | 0 | 0 | −1 | 1 |

FIG. 13

| | | | | |
|---|---|---|---|---|
| CASH PAYMENT DATA PULSE TRAIN | PULSE TRAIN IN SEQUENCE | CASH PAYMENT DATA | — | — |
| CASE PAYMENT DATA | DIRECT PRODUCT | ACCOUNT NUMBER | CASH PAYMENT AMOUNT | — |
| ACCOUNT NUMBER | — | — | — | — |
| CASH PAYMENT AMOUNT | — | — | — | — |
| CASH PAYMENT AMOUNT PULSE TRAIN | PULSE TRAIN IN SEQUENCE | CASH PAYMENT AMOUNT | — | — |
| CASH PAYMENT AMOUNT | — | — | — | — |
| CARD NUMBER | — | — | — | — |
| RECEPTION DEMAND SIGNAL OF CASH PAYMENT | — | — | — | — |
| CARD RECEPTION DEMAND | — | — | — | — |
| INPUT DEMAND | — | — | — | — |
| ENTRY DATA | DIRECT PRODUCT | ACCOUNT NUMBER | BALANCE | CASH PAYMENT AMOUNT |
| BALANCE | PULSE TRAIN IN NOT SEQUENCE | PERSONAL BALANCE | — | — |
| PERSONAL BALANCE | DIRECT PRODUCT | ACCOUNT NUMBER | PERSONAL BALANCE | — |
| PERSONAL BALANCE | — | — | — | — |

- • : INITIAL POSITION
- ○ : 1st POSITION
- ▲ : 2nd POSITION
- △ : 3rd POSITION
- ■ : 4th POSITION

FIG. 17A

| CASH DISPENSER | | FLAG WHICH DISTINGUISHES IF THE PRESENT STEP IS IN THE STEP OF TOKEN (5h SHOWN IN FIG. 12) CHANGES AS FOLLOWS | | | | |
|---|---|---|---|---|---|---|
| PLACE NAME | DATA STRUCTURE NAME | INITIAL SITUATION | 1st SITUATION | 2nd SITUATION | 3ed SITUATION | 4th SITUATION |
| $P_{CD_6}$ | CARD NUMBER | 1 | 0 | 0 | 0 | 0 |
| $P_{CD_4}$ | RECEPTION DEMAND SIGNAL OF CASH PAYMENT | 0 | 1 | 0 | 0 | 0 |
| $P_{C_3}$ | CASH PAYMENT AMOUNT | 0 | 0 | 1 | 0 | 0 |
| $P_{C_2}$ | ACCOUNT NUMBER | 0 | 1 | 1 | 0 | 0 |
| $P_{C_1}$ | CASH PAYMENT AMOUNT | 0 | 0 | 0 | 1 | 0 |
| $P_{CD_2}$ | CARD RECEPTION DEMAND | 0 | 0 | 0 | 0 | 1 |

FIG. 17B

| HOST COMPUTER | | FLAG WHICH DISTINGUISHES IF THE PRESENT STEP IS IN THE STEP OF TOKEN (5h SHOWN IN FIG. 12) CHANGES AS FOLLOWS | | | | |
|---|---|---|---|---|---|---|
| PLACE NAME | DATA STRUCTURE NAME | INITIAL SITUATION | 1st SITUATION | 2nd SITUATION | 3ed SITUATION | 4th SITUATION |
| $P_{h_2}$ | ENTRY DATA | 0 | 0 | 0 | 1 | 0 |
| $P_{h_1}$ | BALANCE | 1 | 1 | 1 | 0 | 1 |

SYSTEM FUNCTION SIMULATION METHOD AND APPARATUS THEREFOR USING PETRI NET SYMBOLS

This application is a continuation of application Ser. No. 730,862, filed May 6, 1985, now abandoned.

BACKGROUND OF THE INVENTION

1. Field of the Invention

The present invention relates to a function simulation method and an apparatus therefor and, more particularly, to simulation method and apparatus which are suitable for function simulation of an asynchronously and parallel operative distributed system. In this simulation method, moreover, a Petri net model conducts the simulation of a function to transform the input data into the output data of the system.

2. Description of the Prior Art

There has not yet been established a method which is suitable for simulating the functions of an asynchronous self-controlled distributed system rather than a synchronous system.

The Petri net, a numerical model for describing and analyzing the flow and control of data in an asynchronous, parallel system, was proposed by Petri in 1962. 43 The Petri net model has been widely used and studied. See "Spectral Feature 'Putting Petri nets to Work'" (by Tilak Agerwala, IEEE, Computer, December 1979, pp. 85 to 94).

Petri nets are expressed by an oriented graph which has two kinds of nodes, i.e., places and transitions. Arcs are oriented from the places to the transitions or vice versa. The places have tokens, and the arrangement of these tokens are called the "markings" of the Petri net model, the first of which is called the "initial marking" of the Petri net.

When a system is to be simulated by a Petri net model, the passage of the token through the transition means that data is processed and output. The token indicates data movement, but it does not indicate which data structure has been transformed nor does it indicate what structure it has been transformed into. This has the obvious disadvantage that data transforming procedures which are crucial in the simulation of functions are left undisclosed.

SUMMARY OF THE INVENTION

An object of the present invention is to simulate function of an asynchronous and parallel system with a Petri net model.

Another object of the present invention is to provide a simulation system which can track changes in data structure as the simulation proceeds.

The present invention is characterized by dividing a system to be simulated into a plurality of asynchronous process units; by preparing a table for the entire structure with both functions, which are defined as divided processes and other processes, and input/output data; by preparing a system structure table with said processes with a Petri net model; storing the structures of said input/output data in the data structure table; and by conducting simulation with said three tables while displaying, through some means, the procedures or results of said simulation.

BRIEF DESCRIPTION OF THE DRAWINGS

FIGS. 9(a) to (g) exemplify transfer of information between the terminals and the host computer and the data structures;

FIG. 12 shows a system structure table according to the examples of FIG. 9;

FIG. 13 likewise shows an example of the data structure table;

FIGS. 17(a) and (b) exemplify the token flags in the functional simulation places.

DESCRIPTION OF THE PREFERRED EMBODIMENTS

The present invention aims to comprehend not only the movements of tokens but also their data transformation procedures and to simulate asynchronous, parallel operation. An example of such a system is considered here where a plurality of cash dispensers for depositing and dispensing money by means of credit cards are coupled to a host computer.

Figure 1:
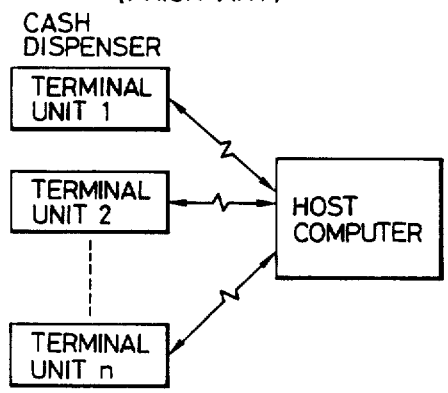
FIG. 1 is a block diagram showing the case in which a plurality of cash dispensers are coupled to one host computer.
Figure 2:
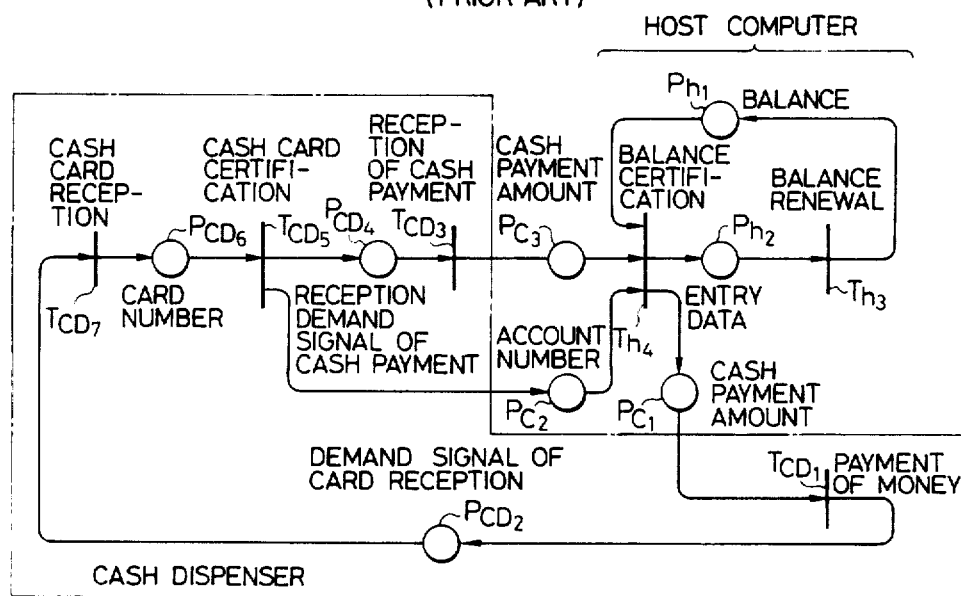
FIG. 2 is a diagram showing the processing of the cash dispenser and the host computer with a Petri net model.

FIG. 1 is a block diagram showing the structure in which cash dispensers are coupled to a host computer. This is an example in which a number n of terminal units are connected to the host computer through communication lines. The relationship between one terminal unit and the host computer is expressed by the Petri net models, as shown in FIG. 2. FIG. 2 shows the case in which money is dispensed by using cash cards.

In FIG. 2, reference letters $T_{CD1}$, $T_{CD3}$, $T_{CD5}$ and $T_{CD7}$ indicate transition, and letters $P_{CD2}$, $P_{CD4}$ and $P_{CD6}$ indicate places, both being located at the side of the cash dispenser. Letters $P_{C1}$, $P_{C2}$ and $P_{C3}$ indicate the communication line places; letters $T_{h3}$ and $T_{h4}$ the host computer transition; and letters $P_{h1}$ and $P_{h2}$ the host computer places.

Let us consider the on-line system of a bank which comprises a host computer and cash dispensers so that information such as account numbers or amount of cash payment is exchanged between host computer and dispenser. The host computer computes and executes balance renewal, and the cash dispensers verify cash cards and accept and dispense cash independently of one another.

If the functions of such a system are simulated, the respective components are mixed rather than separated. This makes it impossible to determine the relationship of a particular function to the system or to other functions so that the functions and operations intrinsic to the system cannot be identified and defined for simulation.

The processing flow will now be schematically explained. The cash card is received at transition $T_{CD7}$; the card number is read at the place $P_{CD6}$; and the cash card is verified at the transition $T_{CD5}$. A cash payment demand signal is generated at the place $P_{CD4}$; payment is received at transition $T_{CD3}$; and the cash payment amount is transmitted to the host computer through the place $P_{C3}$. From the transition $T_{CD5}$, the account number is transmitted through the place $P_{C2}$ to the host computer. At transition $T_{h3}$, the host computer determines the cash payment amount, the account number and the balance (at $T_{h4}$) after the cash is dispensed, so as to certify the balance (at $P_{h1}$) When predetermined conditions are satisfied, the host computer transmits the cash payment amount through the place $P_{C1}$ to the cash dispenser so that the cash is dispensed (at $T_{CD1}$) After a series of these processings, the host computer then allows a subsequent card reception demand signal (at $P_{CD2}$). The place $P_{h2}$ at the host computer indicates maintaining data, i.e., the cash payment amount. Letters $P_{C1}$ to $P_{C3}$ indicate memory buffers which can belong to terminals or to the host computer.

Figure 3:
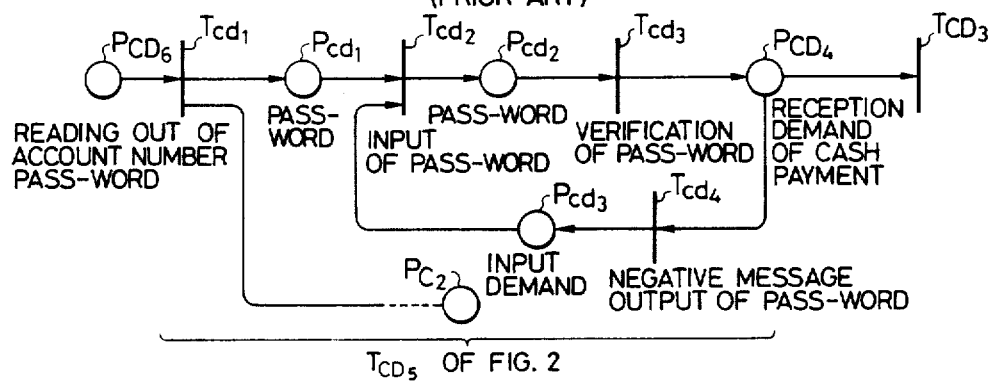
FIG. 3 is a detailed diagram showing a portion of FIG. 2.

FIG. 3 shows the transition $T_{CD5}$ of FIG. 2 in detail. $T_{cd1}$ indicates reading the user I.D.; $T_{cd2}$ indicates input of user I.D.; $T_{cd3}$ indicates verification of user I.D.; $T_{cd4}$ denotes an error message indicating wrong user I.D. (NG); $P_{cd1}$ and $P_{cd2}$ denote user I.D.; $P_{cd3}$ denotes a place having an input demand. $P_{CD4}$ indicates the place which is equivalent to $P_{CD4}$ of FIG. 2 but contains oriented graphic expressions for the transition $T_{cd4}$.

Figure 4:
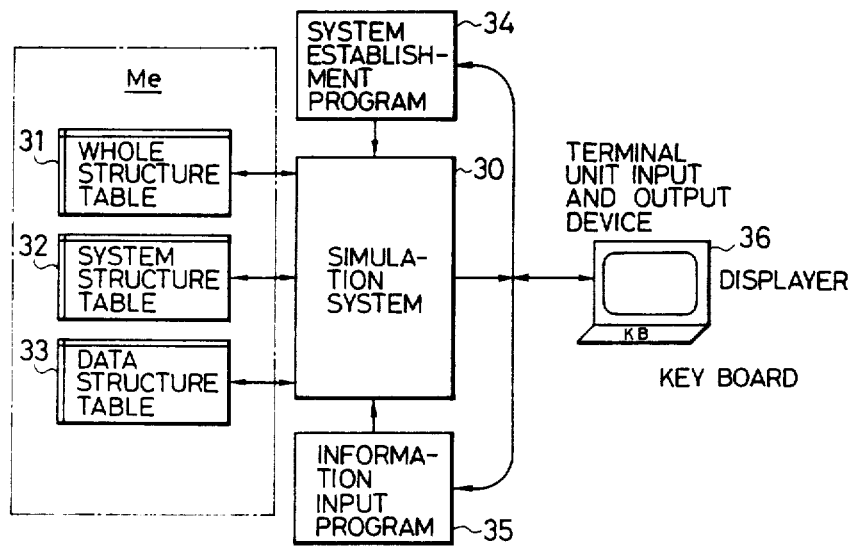
FIG. 4 is a block diagram showing the whole structure of the present invention.

FIG. 4 is a block diagram of the structure of an embodiment of the present invention.

A whole structure table 31, a system structure table 32 and a data structure table 33 are mounted on a memory unit (Me), which stores the data concerning the system to be simulated. A system determining program 34 reads in the simulation initializing point in the target system, which is determined by an input-output device so as to prompt the simulation system 30.

An information input program 35 displays the information required of the simulation system 30 as the input demand in the input-output device 36 and inputs the necessary information from that device to the simulation system 30. This simulation system 30 simulates, when it is informed of the target system and the simulation initialization point from the system determining program 34, the system which is stored in the whole structure table 31, the system structure table 32 and the data structure table 33, to display the procedures in the input-output device 36.

Figure 5:
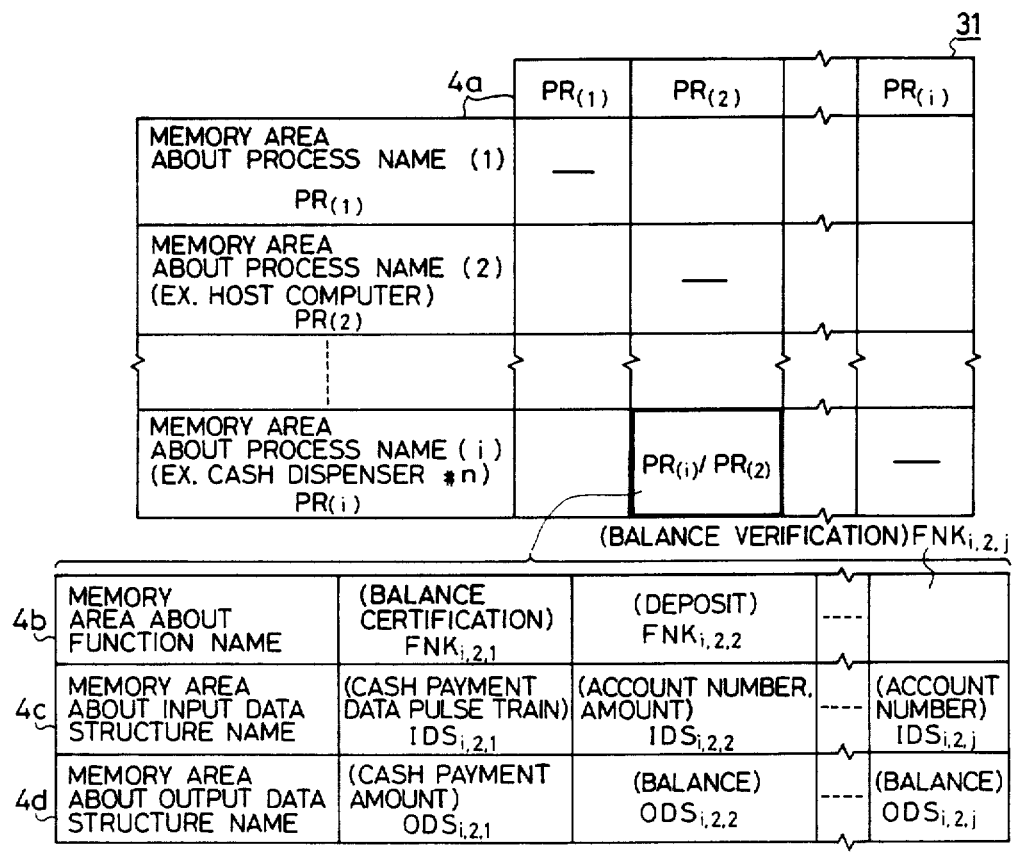
FIG. 5 shows the construction of the whole structure table of FIG. 4.

Next, the structural components of FIG. 4 will be described. The whole structure table 31 is shown in FIG. 5. A process distinguishing name, hereafter called the "process name" is used in constructing the system. This is stored in a memory area 4a ($PR_1$ to $PR_i$) Here, i indicates the number of processes which are required for expressing the target system. In the example of FIG. 2, the memory area corresponds to the number of terminal units n, the cash dispensers, and the host computer.

Now, if it is assumed that information from the host computer of FIG. 2 is stored in the place $PR_2$, and that information from the cash dispenser of FIG. 2 is stored in the place $PR_1$, then, process name information related to memory areas 4b, 4c and 4d is stored in places $PR_2$ to $PR_i$ of FIG. 5.

The memory area 4b, ($FNK_{1,1,1}$ to $FNK_{i,i,j}$) for the process name contains the function names, which are to be input from the line processes and transformed and output to the column processes, of the functions belonging to the line processes between the processes which are stored in the process name memory areas constructing the system. Here, i has a meaning similar to the aforementioned one. indicates the total number of functions belonging to the column processes, which are to be used by the line processes.

The memory area 4c (i.e., $IDS_{1,1,1}$ to $IDS_{i,i,j}$) for the input data structure names corresponds to the function name memory area and contains the data structure names to which the functions stored in the function name memory area are to be input. Here, i and j have meanings similar to the aforementioned ones.

The memory area 4d (i.e., $ODS_{1,1,1}$ to $ODS_{i,i,j}$) for the output data structure names contains the data structure names from which the functions stored in the function name memory area are output. Here, i and j have meanings similar to the aforementioned ones.

Figure 6:
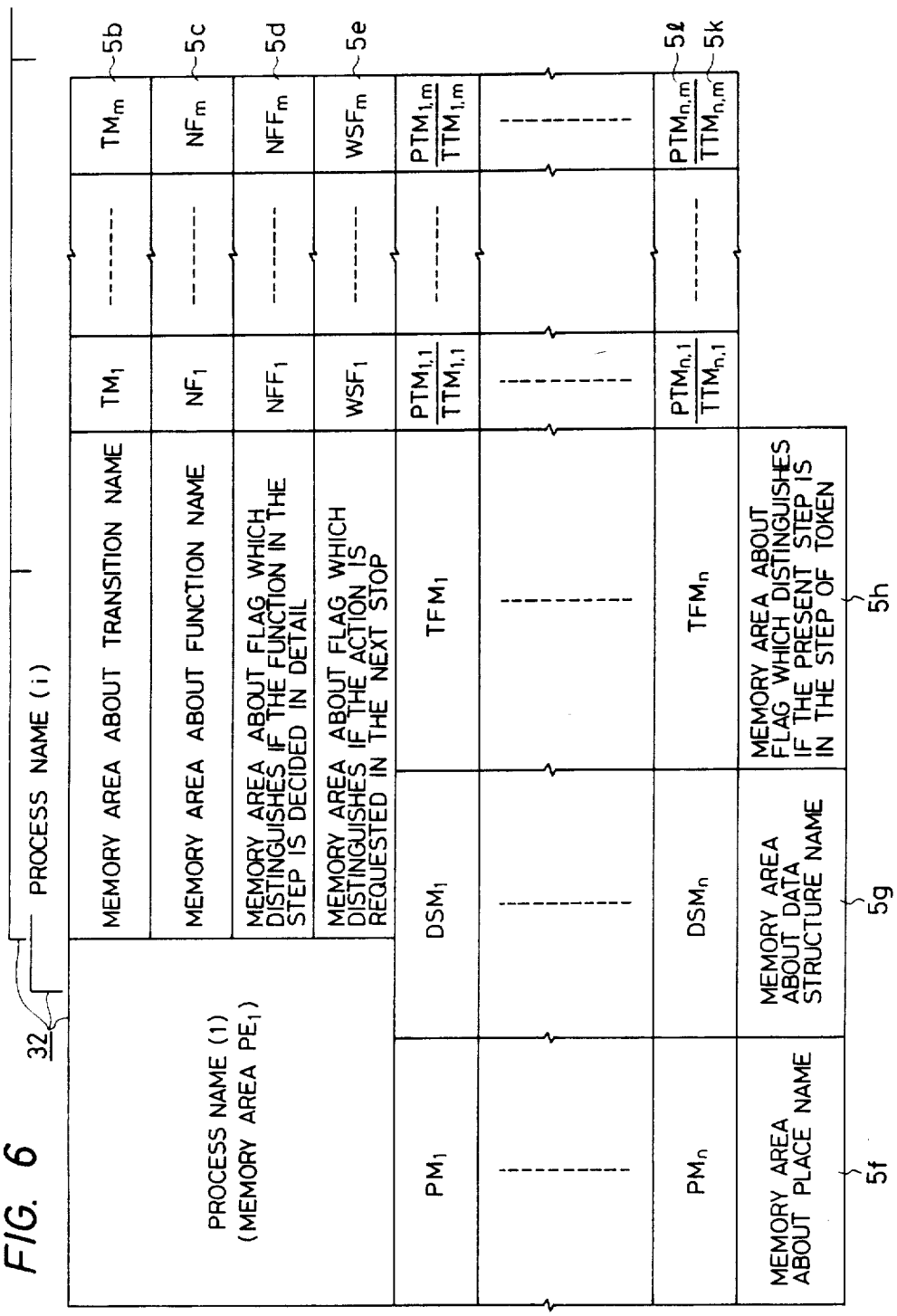
FIG. 6 shows the construction of a system structure table of FIG. 4.

The system structure table 32 is shown in FIG. 6. The memory area 5a (i.e., $PF_1$ to $PF_i$) for the function or process name contains the structures of the respective functions (containing the processes) in the system structure table at a unit of the function (containing the process). Here, i indicates the total number of functions and processes which are required of the target system as a whole.

A memory area 5b (i.e., $TM_1$ to $TM_m$) for transition names stores recognition names for distinguishing transitions. Here, letter m indicates the number of transitions required to express the system to be simulated.

A memory area 5c (i.e., $NF_1$ to $NF_m$) for function names corresponds to the transition name memory area and contains the names of the functions to be conducted by the transitions. Here, m has a meaning similar to the aforementioned one.

A memory area 5d (i.e., $NFF_1$ to $NFF_m$) for flags, which determine the details of function in the step corresponds to the function name memory and contains information as to whether the functions of the names of the respective function name memory areas are detailed by the system structure table. Here, m has a meaning similar to the aforementioned one.

A memory area 5e (i.e., $WSF_1$ to $WSF_m$) for flags, which determine whether action is requested in the next step, contains information as to whether the token has moved to another system structure table and whether the system is awaiting its return. Here, m has a meaning similar to the aforementioned one.

A memory area 5f (i.e., $PM_1$ to $PM_n$) for place names contains identifiers (hereafter called place names) which denote the standby location of the token. Here, n indicates the number of place names required to represent the target system.

A memory area 5g (i.e., $DSM_1$ to $DSM_n$) for data structure names contains the names of the data structures which are to be held by the token standing by in said place. Here, n has a meaning similar to the aforementioned one.

A memory area 5h (i.e., TFM$_1$ to TFM$_n$) for flags which determine whether the present step is a token step corresponds to the place name memory area and contains data indicating whether the token is present in said place. Here, n has a meaning similar to the aforementioned one.

A memory area 5l (i.e., TFM$_1$ to TFM$_n$) for the relationship between places and transitions corresponds to the place name memory area and the transition name memory area and contains data indicating the relationship between places and transitions. The relationships are those in which the token moves from place to transition, those in which the token moves from transition to place, and those in which there is no relationship between transition and token. Here, n and m have meanings similar to the aforementioned ones.

A memory area 5k (i.e., TTM$_{1,1}$ to TTM$_{n,m}$) for token movement data corresponds to the memory area for the relationship between places and transitions and contains data indicating which transition the token moves to in case the token can move from a place to a plurality of transitions. Here, n and m have meanings similar to the aforementioned ones.

Figure 7:
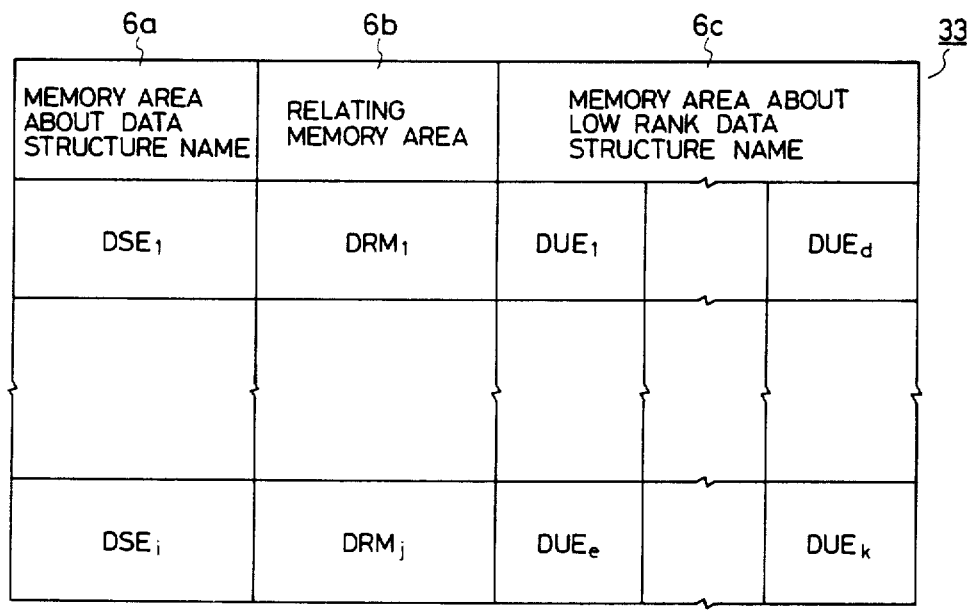
FIG. 7 shows the construction of a data structure table of FIG. 4.

Next, the data structure table 33 is shown in FIG. 7. A memory area 6a (i.e., DSE$_1$ to DSE$_i$) contains data structure names. Here, i indicates the number of the data structure names required to represent the system to be simulated.

A memory area 6c (DUE$_1$ to Due$_k$) for subordinate data structure names corresponds to the data structure name memory area and contains the subordinate data structure names for data structure names stored in the data structure name memory area. Here, k indicates the total number of subordinate data structure names for the data structure names.

A related memory area 6b (i.e., DRM$_1$ to DRM$_j$) corresponds to the data structure name memory area and it contains data indicating how the data structure names are related to the subordinate data structure names. Here, J indicates the number of relationships which are required for preparing the data structure to represent the system to be simulated.

Figure 8:
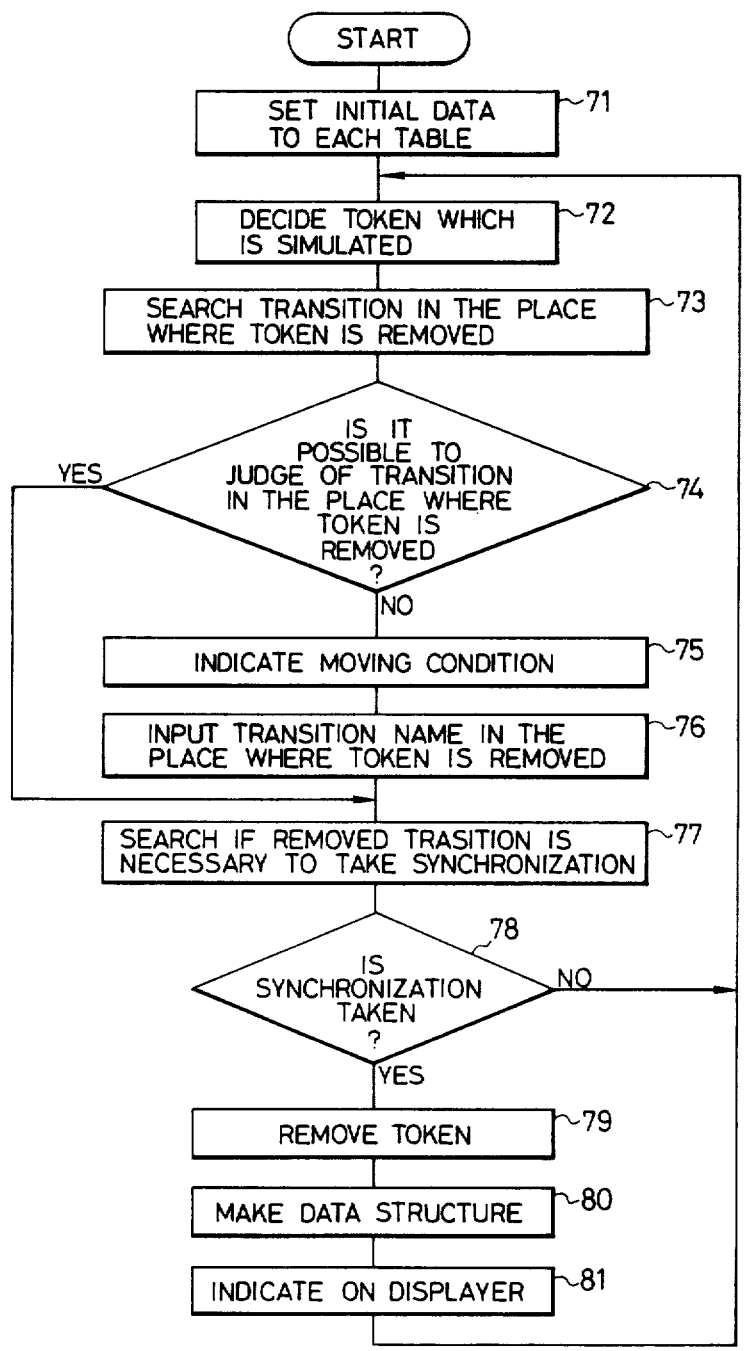
FIG. 8 is a simulation processing flow chart in the system simulation system.

The simulation system 30, containing a processor, executes the process indicated in the flow chart shown in FIG. 8.

The operation of the present simulation system 30 will be described by considering a specific example, the system which is shown in FIG. 9. FIG. 9(a) shows a simple system structure, the host computer and a cash dispenser coupled to the host computer. The process names indicate the relationship between the cash dispenser and the host computer. The data structure names to be transmitted from the cash dispenser to the host computer correspond to the cash payment data pulse train, and the data structure names to be transmitted from the host computer to the cash dispenser correspond to the cash payment amount. The host computer executes the functions to input, transform and output the data structures from the cash dispenser, namely, the functions for balance verification.

FIGS. 9(b) and (c) show the data structures to flow between the processes. For example, the relationships between the data structure name "cash payment data pulse train" and the cash payment data are expressed by a pulse train.

Figure 9E:
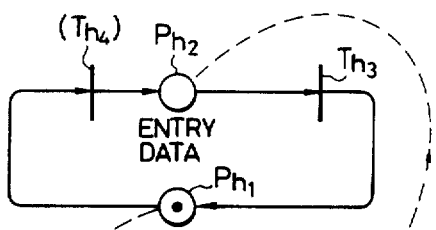
Figure 9F:
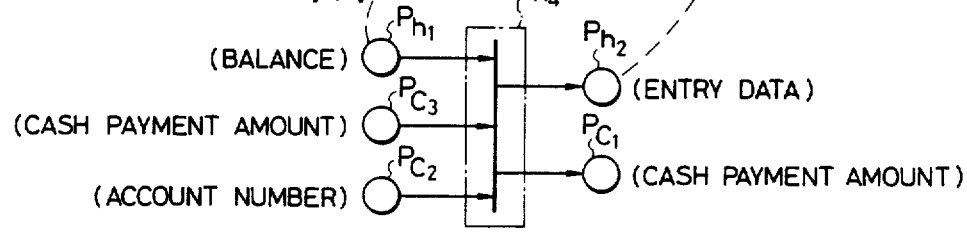
Figure 9G:
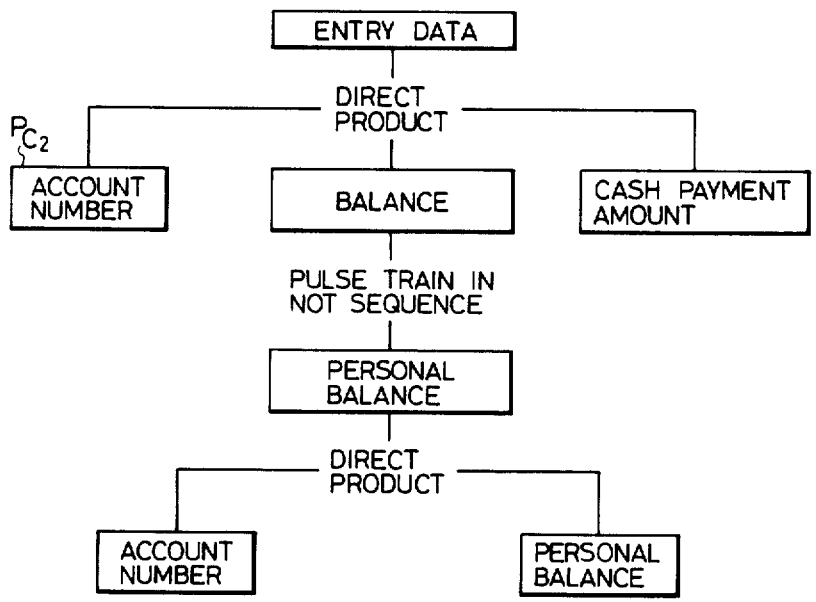

FIGS. 9(d) to (g) show the internal structures of the functions. FIG. 9(g) shows the data structure of a portion of the data structure names shown in FIGS. 9(d) to (g). Letters P and T indicate places and transitions, respectively.

In FIG. 9(a), the system is constructed of processes called the "cash dispenser" and the "host computer". The data called the ⇌cash payment data pulse train" and the "cash payment amount" are transferred between the cash dispenser and the host computer. FIG. 9(b) shows the structure of the data structure name "cash payment data pulse train" to be transmitted from the cash dispenser to the host computer, and shows that the "cash payment data pulse train" is given as the pulse train in sequence with the cash payment data composed of the account number and the cash payment amount.

FIG. 9(d) shows the Petri net model for the cash dispenser. The P$_{CD2}$, P$_{CD4}$, P$_{CD6}$, P$_{C1}$, P$_{C2}$ and P$_{C3}$ indicate places, and the T$_{CD1}$, T$_{CD3}$, T$_{CD5}$, T$_{CD7}$ and T$_{h4}$ indicate the transitions.

The function assigned to the transition T$_{h4}$, i.e., the "the host computer: balance certification" does not indicate execution of the present function in the cash dispenser; it indicates the attainment of the resultant data by sending the data to the function of the "host computer", i.e., the "balance verification". In other words, it is shown that the data is transferred between these processes during the execution of the present function.

Figures 10, 11:
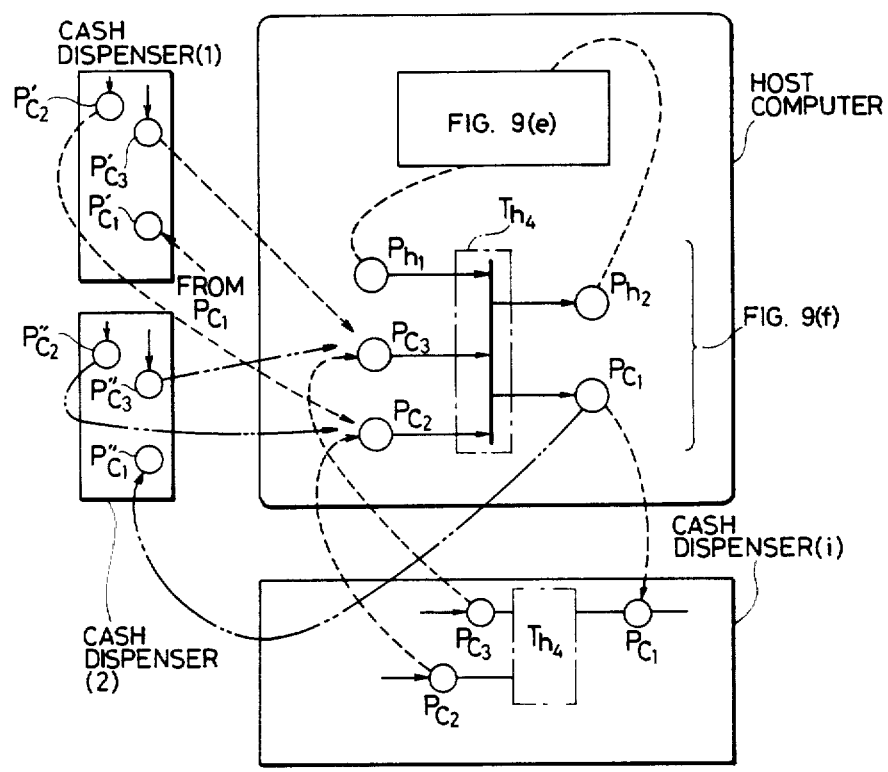
FIG. 10 shows the coupling between the host computer and the terminal unit, i.e., the cash dispenser through points in the Petri net model.
FIG. 11 shows an example of the whole structure table.

The simulation system 30 conducts, at step 71 of FIG. 8, the initial determination of the whole structure table, the system structure table, the data structure table and the tokens, which are required for the simulations, in accordance with the system determining program 34 of FIG. 4. The whole structure table is prepared on the basis of the information shown in FIG. 9(a). Here, the whole structure of the present embodiment is shown in FIG. 10. The host computer is coupled to the cash dispensers. The function of the host computer, i.e., the "balance verification" is also used in the cash dispensers. Moreover, this function is executed when the tokens are at the place (P$_{h1}$) called "balance", the place (P$_{C1}$) called "cash payment amount", and at the place P$_{C2}$ called "account number". If one cash dispenser makes use of the "balance verification" of the host computer, the other cash dispensers are made to wait because the tokens cannot set at "balance certification", "cash payment amount" and "account number".

The whole structure table reflecting the information of FIG. 9(a) is shown in FIG. 11. The system structure table is prepared on the basis of the information shown in FIGS. 9(d) to (f). The system structure table reflecting the information of FIG. 9(d) is prepared in accordance with FIG. 6 and is shown in FIG. 12. FIGS. 9(e) and (f) are also prepared in a similar manner (although not described in the present example). In FIG. 12, the "token present" flag memory area 5h is set at "absence" (0), and the action requesting state flag memory area 5e is set at "non-standby" (0). The data structure table is prepared on the basis of the information shown in FIGS. 9(b), (c) and (g). The data structure table reflecting the information of FIGS. 9(b), (c) and (g) is shown in FIG. 13. Moreover, one or more tokens are set at the start position of the simulation at a process unit. The initial data thus far described is determined.

An example of simulation will be described in the following where tokens are set at P$_{CD6}$ of FIG. 9(d) and at P$_{h1}$ of FIG. 9(e).

At a step 72 of FIG. 8, all the "token present" flag memory areas of all the system structure tables are examined to determine all the places where the tokens are present. The present example corresponds to the cases in which the tokens are input from the input-output device 36 and the $P_{CD6}$ of the cash dispenser and the $P_{h1}$ of the host computer.

At a step 73 of FIG. 8, the respective tokens identified at step 72 are judged as to the relationships between places and transitions of the system structure table. It is determined whether the number of "removal from place to the transition" relationships is two or more, one or none. In the case of the present example, there exists the transition of removal from the "$T_{CD5}$ of the $P_{CD6}$ of the cash dispenser" and the "$T_{h4}$ of the $P_{h1}$ of the host computer".

At step 74, it is determined in accordance with the result revealed at the step 73 whether the function to be executed next can be simulated. In case the number of the relationships examined at the step 73 and present between the places and the transitions is two or more, the destination of the token cannot be determined, but step 75 is executed. In the present example, the token at the $P_{CD6}$ of the cash dispenser can be moved to the transition $T_{CD5}$ whereas the token at the $P_{h1}$ of the host computer can be removed to the transition $T_{h4}$ so that the step 77 is conducted.

At a step 75, the content of the token removing memory area, which contains the relationship of the "removal from place to transition" is displayed on the input-output device. Moreover, the transition to which the token is removed is selected.

At step 76, the transition in the place where the token is removed is input from the input device of the input-output device 36 by the use of the information input program 35.

At a step 77, synchronization of the destination transition found at steps 74 and 76 is confirmed. For the destination transition which has been identified at steps 74 and 76, as shown in FIG. 6, a search determines that all "token present" flags corresponding to place names relating to the "removal from place to transition" indicate "presence", and that all token presence flags corresponding to the place names relating to the "removal from the transition to the place" indicate "absence". If the token removal condition memory area is present at that time, it is searched to find whether the destination transition has been selected at step 76.

For tokens having no destination transition, all place name token presence flags stored in the system structure table, in which the destination tokens are present, but have no relationship to the "removal from place to transition" are checked. Then, it is assumed that synchronization has been done for "presence", but not for "absence".

At a step 78, if the results from step 77 reveal that all the token presence flags indicate "presence", that the token is absent from the destination and that the removal condition of the token is satisfied, it is determined that synchronization has been taken in case the destination transition is selected, and the operation advances to step 79. Otherwise, the operation is returned to step 72. In the present example, both tokens are synchronized so as to be subjected to step 79.

At this step 79, if the destination transition of the token of FIG. 6 to be removed is present, the detailed presence flag memory area 5d of the function of the transition is examined. In the case of the state of the "absence of the detail of the function", the data of the place name token presence flag memory area relating to the "removal from place to transition" of the related memory area for place and transition of the destination transition are determined at "absence", whereas the data for the place name token presence flag memory area 51 relating to "removal from the transition to the place" are determined at "presence". In the memory area 51 the value "0" means no relationship, the value "1" means the removal from the place to the transition, and the value "—1" means the removal from the transition to the place.

Here, the column of intersections of $P_{CD6}$ - $T_{CD5}$ in FIG. 12, for example, will be described in the following. An arc is present from the place $P_{CD6}$ to the transition $T_{CD5}$. This is expressed at [1] in the upper lines. There is no special condition at this time. This is expressed at [—] in the lower lines. In the column of the intersections of $P_{CD6}$ - $T_{CD7}$, the value [—1] in the upper lines indicates that an opposite arc is present, and the value [1] in the lower lines indicates that no special condition is present.

For the condition "details of the function are determined", the action requesting condition flag memory area 5e corresponding to said transition is set at "1", in which "the token is being removed to another system structure table", to examine the system structure table which is coincident with the discriminator stored in the "function name or process name memory area" of that system structure table coinciding with the function name of the function name memory area. The coinciding system structure table will be called the "destination system structure table", whereas the system structure table in which said token is present will be called the "destination system structure table". The memory area 5e is set at "0" in the absence of the request.

In the place-transition relating memory area al of the destination system structure table, it is possible to determine the data structure name belonging to the place name to which the token can be removed from the destination transition.

In the data structure name memory area of the destination system structure table, one coincident with said data structure name is examined, and the flag or the "token present" flag memory area corresponding to the coincident data structure name is set at "present".

In the destination system structure table, the "token present" flag indicating the token to be removed is set at the "absent".

In case the destination transition of the token to be removed is absent, both the function name of the "function name or process name memory area" of the system structure table, in which said token to be removed is present, (which will be called the "destination system structure table"), and the data structure name corresponding to the name of the place, in which said token is present, are examined (which will be called the "destination function name and destination data structure name").

Next, the function name memory area of another system structure table is examined to find the one with the destination function name. If a matching name is found, it is determined whether or not the data of the action requesting state flag memory area corresponding to the coincident function name are in the state where "the token is being removed to another system structure table". If no matching name is found, the search continues. If a matching name is found, the data for the action requesting state flag memory area are set at "non-standby", and the "token present" flag memory area for the place name having the data structure name coincident with the destination data structure name is set at "present" whereas the token presence flag indicating the destination token of the destination system structure table is set at "absent".

At step 80, the input data structure and the output data structure of the transition, through which the token has passed, are prepared. More specifically, the data structures, which have been held by the tokens present in all the places of the place names relating to the transition names at the previous step, are prepared with reference to FIG. 7. In other words, the relationships between the data structure names and the subordinate data structure names, and the subordinate data structure names are examined in view of the data structure table by using as keys, those data structure names which correspond to the place names for preparing the data structure. The subordinate data structure names attained as a result of the examinations are further examined in a similar manner. These examinations are repeated when examination has revealed that no subordinate data structure names are present.

At step 81, the execution procedures for the aforementioned functions are displayed on the input-output device 36. At the end of the present step, the operation is returned to step 72.

Figure 14:
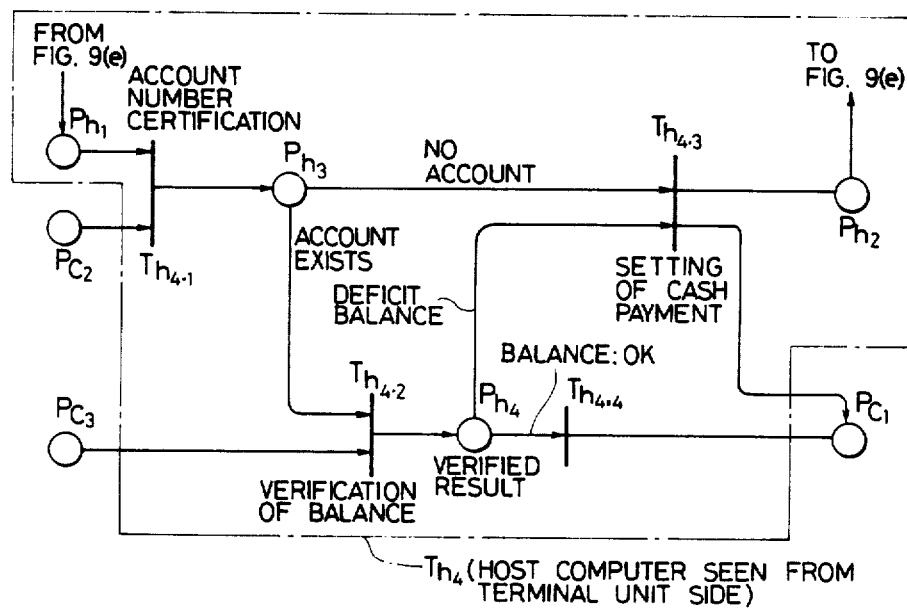
FIG. 14 exemplifies a detailed diagram of the host computer which is expressed by a Petri net model.
Figure 15A:
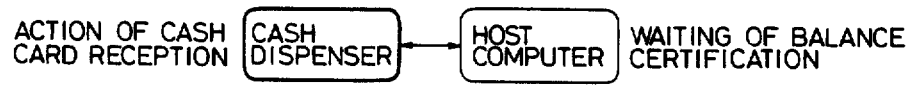
FIGS. 15(a) to (d) and FIGS. 16(a) to (c) exemplify the displays of the simulation procedures and the procedures for movement of tokens, respectively.
Figure 15B:
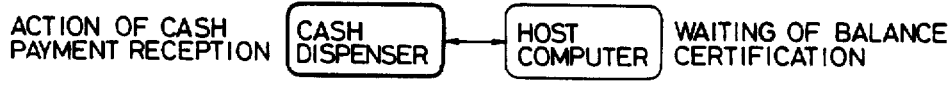
Figure 15C:
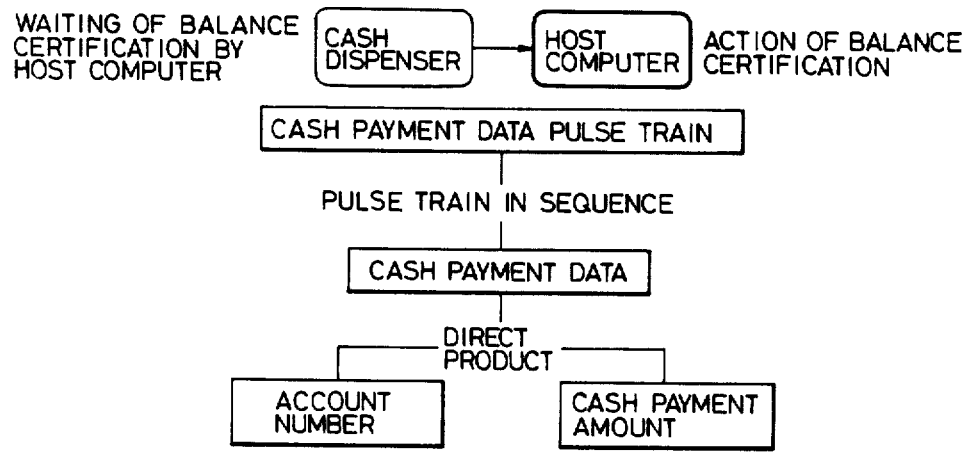
Figure 15D:
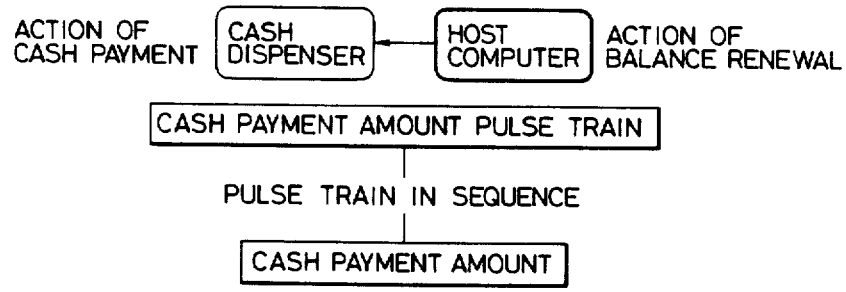

FIG. 14 shows an example of a built-in Petri net model in the transition $T_{h4}$ of the host computer. $T_{h41}$, $T_{h42}$, $T_{h43}$ and $T_{h44}$ indicate transitions, and $P_{h3}$ indicates the place where the result of the account number certification ($T_{41}$) is present. As a result, the token is removed to transition $T_{43}$ if the account is absent and to transition $T_{42}$ if it is present.

Transition $T_{h4}$ indicated by a single-dotted line in FIG. 14 is the host computer seen from the terminal unit side and can be considered a black box using the places $P_{h1}$ and $P_{h2}$ as the terminal units as seen from the host.

The display procedures when the system simulation in this example is executed are shown in FIGS. 15(a) to (d) and FIG. 16 (a) to (c). Here, the display procedures shown are those which are executed by the uppermost-rank function.

FIG. 15 shows the operation of the whole system microscopically. The cash dispenser executes "cash card reception" as a result of the first transition, and the host computer waits for the execution of "balance certification" as shown in FIG. 15(a). As a result of the second transition, as shown in FIG. 15(b), the cash dispenser executes "reception of cash payment", and the host computer awaits for "balance certification". As a result of the third transition (as shown in FIG. 15(c)), the cash dispenser requests "balance certification" of the host computer and waits for it while the host computer executes "balance certification". As a result of the fourth transition, as shown in FIG. 15(d), the cash dispenser executes "cash payment", and the host computer executes "balance renewal". Upon the third transition, "payment data" is removed from the cash dispenser to the host computer. Upon the fourth transition, "cash payment amount" is delivered from the host computer to the cash dispenser.

Figure 16A:
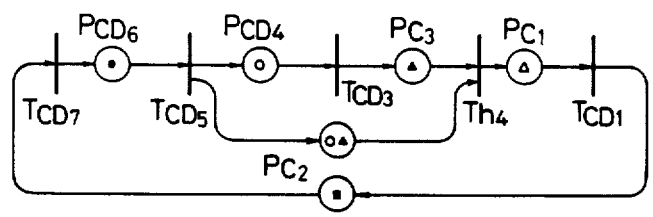
Figure 16B:
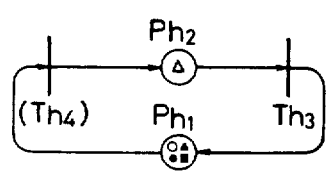
Figure 16C:
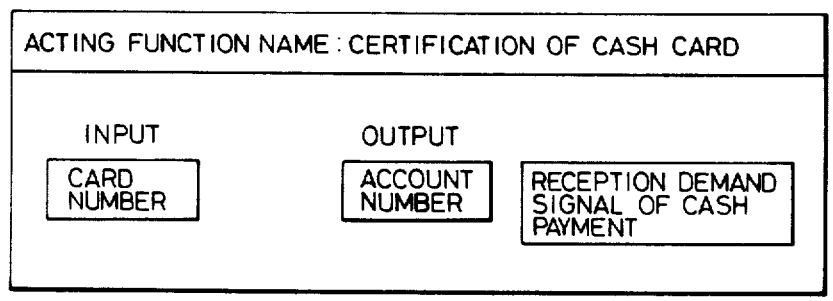

FIGS. 16(a) to (c) show the data structure transformation procedures by the specific token removal. Of the displayed examples, FIG. 16(c) shows the first transition display.

In FIG. 16, the solid circle indicates the initial position of the token, the blank circle indicates the first position, the solid triangle indicates the second position, the blank triangle indicates the third position, and the solid square indicates the fourth position.

FIGS. 17(a) and (b) show the changes of the token presence flags of the function simulation shown in FIG. 12. FIG. 17(a) shows the cash dispenser token presence flag and corresponds to FIG. 16(a). FIG. 17(b) shows the token presence flag in the host computer and corresponds to FIG. 16(b).

With the present system, function simulation of a distributed processing system can be executed properly even in a large, complex system.

Although a cash dispenser has been described hereinbefore, the present invention can be similarly applied to other systems.

What is claimed is:

1. A method of operating a data processing system for simulating the functions of a distributed system constructed of processes which are made respectively asynchronously operative and adapted to conduct their processes independently of one another while transferring information with another process or system, comprising the steps of:

dividing said distributed system into a plurality of asynchronously operative processes;

preparing a whole structure table using both a function, which is to be transferred from one to another of said processes, and the input and output data of said function;

storing a system structure table at each of said processes with a Petri net model composed of transitions, which are defined as the processing of information, tokens, which are defined as a set of data structures, conditions for removing said tokens, and places, which are defined as positions on said system where said tokens stand by, said system structure table for each of said processes including place means, data structure names, token presence flags indicating whether or not said tokens are present in said places, transition names, and function means;

defining a data structure of said input and output data of each function and storing said data structure in a data structure table;

displaying said tokens in a single group;

removing said tokens sequentially in accordance with a predetermined simulation program to trace said processes; and conducting in said data processing system a function simulation of said distributed system using the data stored in said whole structure table, said system structure table and said data structure table while comprehending the data structure change in the data while tracing said process.

2. A method according to claim 1, wherein said whole structure table targets the respective ones of said divided processes and all others of said divided processes and clarifies the functions and input & output of the respective ones of said divided processes.

3. A method according to claim 1, wherein said data structure table is stored with both the relationships between the data and their structure names and low-rank data structure names.

4. A function simulation system of a distributed system composed of processes made respectively asynchronously operative, comprising:

means for dividing said distributed system into a plurality of asynchronously operative processes;

a whole structure memory means for a system to be simulated, which is composed of a function name memory data into which function means are provided by said processes when certain of said processes conduct intrinsic processings while exchanging information with certain other processes, and an input and output data structure name memory area of said function;

a target system structure memory means for each of said processes composed of a transition name memory area which is defined as the processing of information, a token presence flag memory area which is defined as a set of data structures, a token removing condition memory area, a place name memory area which is defined as a position on the system where said tokens stand by, and a data structure name memory area;

a data structure memory means composed of a data structure name memory area of said input and output processing data, a data relationship memory area, and a low-rank data structure name memory area;

a simulation system means for storing a simulation program of a target system and for using said whole structure memory means, said system structure memory means and said data structure memory means to facilitate sequential performance of simulations in accordance with said simulation program; and display means for outputting the procedures or results of said simulations from said simulation system and for displaying the same.

* * * * *